(12) United States Patent
Alexander

(10) Patent No.: US 6,851,096 B2
(45) Date of Patent: Feb. 1, 2005

(54) METHOD AND APPARATUS FOR TESTING SEMICONDUCTOR WAFERS

(75) Inventor: William J. Alexander, Pittsburgh, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 168 days.

(21) Appl. No.: 10/215,383

(22) Filed: Aug. 8, 2002

(65) Prior Publication Data

US 2003/0071631 A1 Apr. 17, 2003

Related U.S. Application Data

(60) Provisional application No. 60/314,065, filed on Aug. 22, 2001.

(51) Int. Cl.[7] .......................... G06F 17/50; G01R 31/26; G01R 31/00; H01L 21/66
(52) U.S. Cl. ........................... 716/4; 324/500; 324/754; 438/17
(58) Field of Search .............................. 716/4; 324/500, 324/754, 717; 438/17, 113–126

(56) References Cited

U.S. PATENT DOCUMENTS

| | | | | |
|---|---|---|---|---|
| 3,628,137 A | * | 12/1971 | Mazur | 324/717 |
| 6,291,254 B1 | * | 9/2001 | Chou et al. | 438/18 |
| 6,365,436 B1 | * | 4/2002 | Faraci et al. | 438/113 |
| 6,429,145 B1 | * | 8/2002 | Hovel | 438/745 |
| 2002/0180474 A1 | * | 12/2002 | Howland et al. | 324/765 |

* cited by examiner

Primary Examiner—Vuthe Siek
Assistant Examiner—Magid Y. Dimyan
(74) Attorney, Agent, or Firm—Webb Ziesenheim Logsdon Orkin & Hanson, P.C.

(57) ABSTRACT

A wafer testing apparatus comprises a sample chuck having a flat surface for supporting a test wafer positioned thereon, the sample chuck having a base structure manufactured of a conductive metal and having a semiconductor layer secured to the base structure defining the flat surface of the sample chuck, an electrical test probe establishing a correction factor corresponding to a location on the semiconductor layer surface to be used to report an electrical property at a location on a test wafer substantially unaffected by the electrical properties of the semiconductor layer and base structure below that location.

15 Claims, 1 Drawing Sheet

METHOD AND APPARATUS FOR TESTING SEMICONDUCTOR WAFERS

CROSS REFERENCE TO RELATED APPLICATION

This application claims priority to U.S. Provisional Patent Application Ser. No. 60/314,065, filed Aug. 22, 2001.

BACKGROUND OF THE INVENTION

1. Field of the Invention

The present invention relates to a sample chuck for wafers and method of testing wafers mounted on the sample chuck.

2. Description of Related Art

Semiconductor wafers are thin, circular slices of doped silicon from which integrated circuits or semiconductor devices are built. Depending on the state of production, the wafers may be referred to as blank wafers, polished wafers, patterned wafers, product wafers, or the like. The largest wafer in current use is 300 mm (12 inch) diameter.

At each stage in the integrated circuit manufacturing process, wafers must be carefully inspected for electrical properties that may have values varying over the surface of the wafers. In a typical apparatus for inspecting the electrical properties of a semiconductor wafer, the wafer is supported on a sample chuck or fixture and a probe tip is caused to contact the surface of the semiconductor. A capacitance-voltage (CV), current-voltage (IV), conductance-voltage (GV), or capacitance-time (Ct) type electrical stimulus is applied to the wafer. The response of the wafer to the electrical stimulus is measured and, from the response, at least one property of the wafer at the point of the probe tip contact is determined.

Prior art sample chucks have flat surfaces for supporting the wafer during testing. They are machined from metals such as aluminum or stainless steel, for example. Sample chucks made from these metals are suitable because they are electrically conductive, providing a uniform potential or electrical ground under the entire wafer during testing. Unfortunately, the wafers can be contaminated by contact with these surfaces. Sample chucks have also been made from pure silicon, but to do so is prohibitively expensive. It has been proposed to manufacture the sample chucks from a conductive metal with a top layer of semiconductor over the surface of the metal so that the semiconductor wafer being tested cannot be contaminated by contact with the conductive metal surface. See application Ser. No. 10/139,685, filed May 3, 2002, entitled "Sample Chuck with Compound Construction", assigned to a common assignee. The disclosure of that application is incorporated herein by reference.

A sample chuck having a semiconductor top layer for testing a semiconductor wafer has potential benefits over known metallic sample chucks in the areas of flatness and lack of contamination. One potential drawback to such a sample chuck, however, is that under certain circumstances, variations in the semiconductor top layer may present themselves as variations in the measurement of capacitance-voltage (CV) data, for example. These variations in CV derived data for a semiconductor wafer under test might include variations from the underlying metal semiconductor chuck. One such variation might be changes in the "series resistance" as a function of position due, in part, to variations in resistivity of the semiconductor top layer.

Sample chucks, also known as wafer carriers, are manufactured to industry specifications to accommodate the standard wafer sizes and orientation features, such as flats and notches. A typical technique for holding the wafer on the sample chuck is to draw a vacuum on the underside of the wafer as shown, for example, in U.S. Pat. No. 3,811,182 entitled "Object Handling Fixture, System, and Process." Techniques for overcoming fixture induced measuring errors are disclosed in U.S. Pat. No. 4,750,141 entitled "Method and Apparatus for Separating Fixture-Induced Error From Measured Object Characteristics and for Compensating the Measured Object Characteristic With the Error, and a Bow/Warp Station Implementing Same."

SUMMARY OF THE INVENTION

It is an object of the present invention to overcome the above problems and others by providing a method of compensating for variations in the electrical properties over the top surface of a semiconductor top layer of a sample chuck. Still other objects of the present invention will become apparent to those of ordinary skill in the art upon reading and understanding the following detailed description.

Briefly, according to the present invention, there is provided a wafer testing apparatus comprising a sample chuck having a flat surface for supporting a wafer positioned thereon. The sample chuck has a base structure manufactured of a conductive metal and a semiconductor layer secured to the base structure defining the flat surface of the sample chuck. The base structure has a plurality of passages therein that may be connected to a vacuum source. There is a plurality of tiny openings extending through the semiconductor layer in communication with the passages in the base structure. The sample chuck has a reference origin and axis, and guides for orienting a wafer relative to the reference origin and axis.

The wafer testing apparatus also comprises an electrical test probe arranged to make contact with the flat surface of the semiconductor layer or the surface of a wafer positioned thereon. Semiconductor layer and wafer test circuits are associated with the electrical test probe for determining and recording an electrical property of the semiconductor layer and base structure data or the wafer at a plurality of locations arrayed over the surface. The test circuit might comprise a digital multimeter or known equipment for CV measurements with the ability to upload data to a general-purpose digital computer.

The wafer testing apparatus comprises an analog or digital circuit or computer for establishing a correction factor based upon the data recorded by the semiconductor test circuits corresponding to a location on the semiconductor layer surface. The correction factor is used to report an electrical property at a location on the wafer substantially unaffected by the electrical properties of the semiconductor layer and base structure below that location.

According to a preferred embodiment, the semiconductor layer and wafer test apparatus gather data at point locations defining a pattern, each point location being easily referenced to the reference origin and axis of the sample chuck. The correction factor for a given location may be obtained by interpolating between the data points on the semiconductor layer.

Most preferably, the wafer testing apparatus according to the present invention determines series resistance between the surface of the semiconductor layer and the base structure.

According to one embodiment of the present invention, the electrical property of the test wafer determined is spreading resistance. According to another embodiment, the electrical property determined is Schottky CV.

Preferably, the tiny openings extending through the semiconductor layer are minimized in number and located relative to the test points in the pattern of test points such that the validity of the interpolation between test points is not compromised. Preferably, the passages in the base structure are located and sized relative to the test points in the pattern of test points such that the validity of the interpolation between test points is not compromised.

Briefly, according to the present invention, there is provided a wafer testing method comprising providing a sample chuck having a flat surface for supporting a wafer positioned thereon, the sample chuck having a base structure manufactured of a conductive metal and having a semiconductor layer secured to the base structure defining the flat surface of the sample chuck, the sample chuck having a reference origin and axis, and means for orienting a wafer relative to the reference origin and axis, providing an electrical test probe arranged to make contact with the flat surface of the semiconductor layer and the surface of a wafer positioned thereon, recording electrical properties of the semiconductor layer and base structure at a plurality of locations arrayed over the semiconductor layer surface, determining an electrical property at a location on the surface of a wafer positioned on the sample chuck, and establishing a correction factor based upon the data recorded by the semiconductor test means corresponding to a location on the semiconductor layer surface to be used to report an electrical property at a location on the wafer substantially unaffected by the electrical properties of the semiconductor layer and base structure below that location.

DESCRIPTION OF THE PREFERRED EMBODIMENTS

Figure 1:
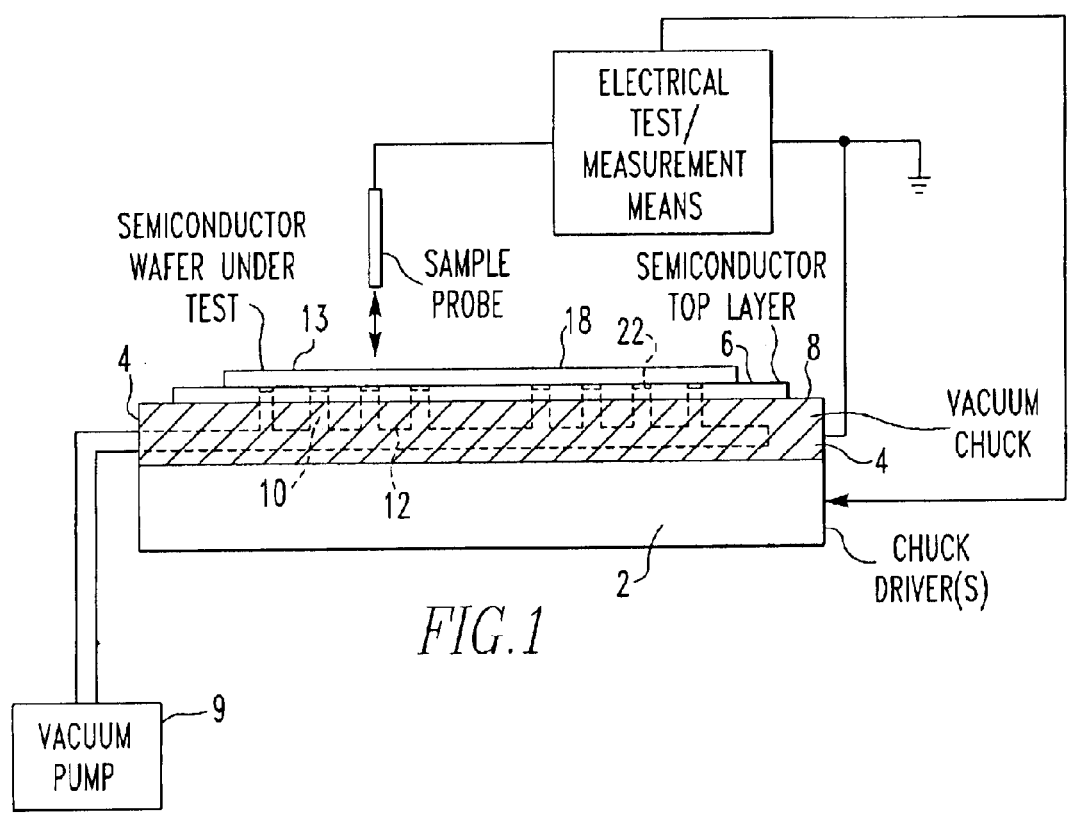
FIG. 1 is a cross-sectional view of a semiconductor wafer under test.
Figure 2:
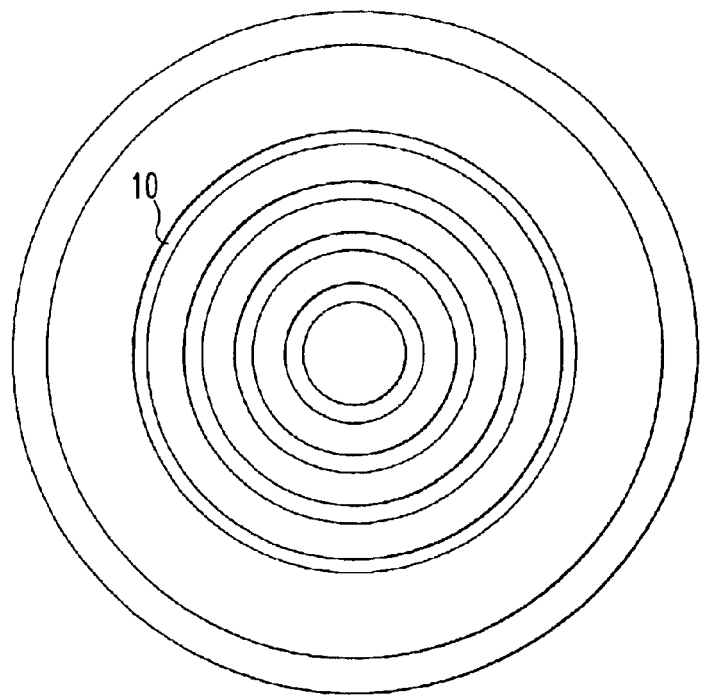
FIG. 2 is a plan view of the vacuum chuck with the semiconductor top layer removed.

With reference to FIG. 1, a sample chuck 2, in accordance with the present invention, is a laminated structure having a lower layer 4 and an upper layer 6 laminated to a top surface 8 of lower layer 4.

Lower layer 4 is formed from an electrically conductive material, such as aluminum, which provides low mass and weight, acceptable structural rigidity, and ease of manufacturing. One or more vacuum passages or grooves 10 may be formed in top surface 8 for connection to a vacuum source 9 via a vacuum duct 12, shown in phantom, which interconnects one or more vacuum passages 10, shown in phantom, to vacuum source 9. Vacuum source 9, vacuum passages 10, and vacuum duct 12 coact to distribute a vacuum to top surface 8, which can be utilized to secure a semiconductor wafer under test 13 to sample chuck 2.

The conductive material forming lower layer 4 is selected to provide a high quality electrical contact for uniformly distributing electrical current during electrical measurement or other electrical operations, e.g., electrical stressing. Top surface 8 of lower layer 4 is made planar by conventional techniques, such as milling or grinding.

A bonding agent, such as an adhesive, a solder, a conductive adhesive, and the like, bond the semiconductor layer to the top surface of the lower layer 4.

When sample chuck 2 is to hold a semiconductor wafer, the upper layer 6 is preferably a semiconductor wafer which has its electrical properties optimized to enhance electrical contact with semiconductor wafer under test 13. A top surface 18 of upper layer 6 can be formed to have a desired degree of planarity utilizing semiconductor wafer processing techniques known in the art.

Upper layer 6 preferably has through-holes 22, shown in phantom, formed therein by conventional semiconductor wafer processing techniques, such as ion milling. Preferably, the size and location of through-holes 22 are selected so that when upper layer 6 and lower layer 4 are laminated together, each through-hole 22 of upper layer 6 is in registry or fluid communication with a vacuum passages 10 in lower layer 4.

Back surface upper layer 6 can be metallized and/or doped with impurities to enhance its conductive and/or adhesive properties. Back surface can be metallized by sputtering or vacuum deposition techniques known in the art of semiconductor wafer processing. Back surface can also be doped with impurities by ion implantation.

The use of a semiconductor wafer for upper layer 6 inherently provides a very flat top surface 18 and eliminates contamination of semiconductor wafers under test 13 from the conductive material forming lower layer 4. It is to be appreciated that forming the sample chuck 2 from semiconducting material alone is not desirable due to the cost and increased mass of such solution. Additionally, forming sample chuck 2 from semiconductor material does not optimize the electrical conductivity of sample chuck 2. However, laminating upper layer 6 formed from a semiconductor wafer to lower layer 4 formed from a conductive material combines the best features of both materials.

The present invention comprises acquiring electrical measurements of a semiconductor top layer of a sample chuck at a plurality of points on the surface of the semiconductor top layer and utilizing these acquired electrical characteristics to correct for subsequent measurements of a semiconductor wafer under test received on the semiconductor top layer.

Upon installation of a sample chuck having a semiconductor top layer, a suitable array of electrical measurements is made at a plurality of locations over or about the surface of the semiconductor top layer. These measurements may include at an x-y array of Schottky CV or spreading resistance measurements. Other arrays based on the polar coordinates may be used. Each CV measurement conventionally uses one of several well-known electrical models to derive a desired value for the measured electrical property. These models include a number of parasitic elements, for example, "series resistance". Typically, these elements have one single value derived at a time of system calibration and used for all subsequent measurements.

The array of electrical measurements is converted into an array of correction factors, such as "series resistance" values, as a function of the location of each electrical measurement on the surface of the semiconductor top layer.

Once the array of correction factors has been determined, a semiconductor wafer under test is received on the sample chuck and, for example, CV measurements are acquired at one or more locations over the surface of the semiconductor wafer under test. A correction factor is utilized at each location to correct for variations in the acquired CV measurement due to variation in the electrical property of the semiconductor top layer. The correction factor at each location is determined based on the position of the location on the semiconductor wafer under test relative to the locations of the electrical measurements on the semiconductor top layer. More specifically, by use of well-known interpolation techniques, the correction factor at each arbitrary location can be determined from the array of electrical measurements acquired at the plurality of known locations over the semiconductor top surface. Use of these correction factors avoids variations in the acquired data due to variations in the electrical properties of the chuck, especially the semiconductor top layer.

As can be seen, mapping the semiconductor top layer of a sample chuck by acquiring an array of electrical measurements that is utilized to form correction factors for correcting for subsequent measurements of a semiconductor wafer under test received on the semiconductor top layer overcomes the problem of variations in the semiconductor top layer that would ordinarily cause variations in CV or spreading resistance measurements.

The present invention has been described with reference to the preferred embodiment. Obvious modifications and alterations will occur to others upon reading and understanding the preceding detailed description.

The invention claimed is:

1. A wafer testing apparatus comprising:
    a sample chuck having a flat surface for supporting a wafer positioned thereon, said sample chuck having a base structure manufactured of a conductive metal and having a semiconductor layer secured to the base structure defining the flat surface of the sample chuck, said base structure having a plurality of passages therein that are connected to a vacuum source, there being a plurality of tiny openings extending through the semiconductor layer in communication with the passages in the base structure, said sample chuck having a reference origin and axis, and means for orienting a wafer relative to the reference origin and axis;
    an electrical test probe arranged to make contact with the flat surface of the semiconductor layer and the surface of a wafer positioned thereon;
    semiconductor layer test means associated with the electrical test probe for determining and recording electrical properties of the semiconductor layer and base structure data at a plurality of locations arrayed over the semiconductor layer surface;
    wafer test means associated with the electrical test probe for determining electrical property data at a location on the surface of a wafer positioned on the sample chuck; and
    means for establishing a correction factor based upon the data recorded by the semiconductor layer test means corresponding to a location on the semiconductor layer surface to be used with the wafer test means to report an electrical property at a location on the wafer substantially unaffected by the electrical properties of the semiconductor layer and base structure below that location.

2. The wafer testing apparatus according to claim 1, wherein the semiconductor layer test means gathers data at point locations defining a pattern, each point location being easily referenced to the reference origin and axis.

3. The wafer testing apparatus according to claim 1 or 2, wherein the means for establishing a correction factor includes means for interpolating between the data points on the semiconductor layer.

4. The wafer testing apparatus according to claim 3, wherein the tiny openings extending through the semiconductor layer are minimized in number such that the validity of the interpolation between test points is not compromised.

5. The wafer testing apparatus according to claim 3, wherein the tiny openings extending through the semiconductor layer are located relative to the pattern of test points such that the validity of the interpolation between test points is not compromised.

6. The wafer testing apparatus according to claim 3, wherein the passages in the base structure are located and sized relative to the pattern of test points such that the validity of the interpolation between test points is not compromised.

7. The wafer testing apparatus according to claim 1, wherein the semiconductor layer test means determines series resistance between the surface of the semiconductor layer and the base structure.

8. The wafer testing apparatus according to claim 1, wherein the electrical property determined by the wafer test means is spreading resistance.

9. The wafer testing apparatus according to claim 1, wherein the electrical property determined by the wafer test means is Schottky CV.

10. A wafer testing method comprising the steps for:
    providing a sample chuck having a flat surface for supporting a wafer positioned thereon, said sample chuck having a base structure manufactured of a conductive metal and having a semiconductor layer secured to the base structure defining the flat surface of the sample chuck, said base structure having a plurality of passages therein that are connected to a vacuum source, there being a plurality of tiny openings extending through the semiconductor layer in communication with the passages in the base structure, said sample chuck having a reference origin and axis and, means for orienting a wafer relative to the reference origin and axis;
    providing an electrical test probe arranged to make contact with the flat surface of the semiconductor layer and the surface of a wafer positioned thereon;
    recording electrical properties of the semiconductor layer and base structure at a plurality of locations arrayed over the semiconductor layer surface by a semiconductor test means associated with said electrical test probe;
    determining an electrical property at a location on the surface of a wafer positioned on the sample chuck; and
    establishing a correction factor based upon the data recorded by the semiconductor test means corresponding to a location on the semiconductor layer surface to be used to report an electrical property at a location on the wafer substantially unaffected by the electrical properties of the semiconductor layer and base structure below that location.

11. The wafer testing method according to claim 10, wherein data at point locations defining a pattern is gathered, each point location being easily referenced to the reference origin and axis.

12. The wafer testing method according to claim 10 or 11, wherein the correction factor is determined by interpolating between the data points on the semiconductor layer.

13. The wafer testing method according to claim 10, wherein the series resistance is determined between the surface of the semiconductor layer and the base structure.

14. The wafer testing method according to claim 10, wherein spreading resistance of the wafer is determined at one or more locations.

15. The wafer testing method according to claim 10, wherein Schottky CV of the wafer is determined at one or more locations.

* * * * *